United States Patent
Bedell et al.

(10) Patent No.: US 11,482,573 B2
(45) Date of Patent: Oct. 25, 2022

(54) MULTI-JUNCTION PHOTOVOLTAIC CELLS

(71) Applicant: International Business Machines Corporation, Armonk, NY (US)

(72) Inventors: Stephen W. Bedell, Wappingers Falls, NY (US); Ning Li, White Plains, NY (US); Qinglong Li, Bristow, VA (US); Kunal Mukherjee, Goleta, CA (US); Devendra Sadana, Pleasantville, NY (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 343 days.

(21) Appl. No.: 15/813,919

(22) Filed: Nov. 15, 2017

(65) Prior Publication Data

US 2018/0331158 A1    Nov. 15, 2018

Related U.S. Application Data

(63) Continuation of application No. 15/595,388, filed on May 15, 2017, now abandoned.

(51) Int. Cl.
*H01L 25/16*    (2006.01)
*H01L 31/0687*    (2012.01)
(Continued)

(52) U.S. Cl.
CPC .......... *H01L 27/302* (2013.01); *H01L 25/167* (2013.01); *H01L 31/02021* (2013.01);
(Continued)

(58) Field of Classification Search
CPC ....... H01L 31/043; H01L 27/30; H01L 31/05; H01L 31/0687; H01L 25/167; H01L 25/18; H02S 40/34
See application file for complete search history.

(56) References Cited

U.S. PATENT DOCUMENTS

| | | | |
|---|---|---|---|
| 4,278,474 | A | 7/1981 | Blakeslee et al. |
| 4,295,002 | A | 10/1981 | Chappell et al. |

(Continued)

FOREIGN PATENT DOCUMENTS

CN    103078678 B    6/2016

OTHER PUBLICATIONS

Appendix P, List of IBM Patents or Patent Applications Treated as Related, dated Nov. 15, 2017, 2 pages.

(Continued)

*Primary Examiner* — Yu Chen
(74) *Attorney, Agent, or Firm* — Cantor Colburn LLP; Stosch Sabo

(57) ABSTRACT

A photovoltaic device including a photovoltaic cell and method of use is disclosed. The photovoltaic cell includes at least a first photovoltaic layer and a second photovoltaic layer arranged in a stack. The first photovoltaic layer has a first thickness and receives light at its top surface. A second photovoltaic layer has a second thickness and is disposed beneath the first photovoltaic layer and receives light passing through the first photovoltaic layer. The first thickness and the second thickness are selected so that a first light absorption at the first photovoltaic layer is equal to a second light absorption at the second photovoltaic layer. The photovoltaic cell is irradiated at its top surface with monochromatic light to generate a current.

6 Claims, 6 Drawing Sheets

(51) Int. Cl.
*H01L 27/30* (2006.01)
*H01L 31/05* (2014.01)
*H02S 40/34* (2014.01)
*H01L 31/02* (2006.01)
*H01L 31/043* (2014.01)
*H01L 31/0693* (2012.01)
*H01L 31/0304* (2006.01)

(52) U.S. Cl.
CPC ........ *H01L 31/0304* (2013.01); *H01L 31/043* (2014.12); *H01L 31/0504* (2013.01); *H01L 31/0687* (2013.01); *H01L 31/0693* (2013.01); *H02S 40/34* (2014.12)

(56) References Cited

U.S. PATENT DOCUMENTS

| | | | |
|---|---|---|---|
| 4,916,296 A * | 4/1990 | Streck | G07B 15/063 340/936 |
| 5,403,404 A | 4/1995 | Arya et al. | |
| 5,990,415 A | 11/1999 | Green et al. | |
| 6,825,408 B2 | 11/2004 | Nagano et al. | |
| 7,952,018 B2 | 5/2011 | Shima et al. | |
| 8,940,580 B2 | 1/2015 | Hekmatshoartabari et al. | |
| 9,105,775 B2 | 8/2015 | Hekmatshoartabari et al. | |
| 9,368,662 B2 | 6/2016 | Mazzer et al. | |
| 9,455,364 B2 | 9/2016 | Sivananthan et al. | |
| 2002/0104889 A1 * | 8/2002 | Forrest | G06K 19/07745 235/492 |
| 2008/0163924 A1 | 7/2008 | Sprung | |
| 2010/0193795 A1 | 8/2010 | Fritzemeier | |
| 2011/0273302 A1 | 11/2011 | Fornage et al. | |
| 2014/0046498 A1 * | 2/2014 | Nakayama | G05B 15/02 700/295 |
| 2015/0162478 A1 * | 6/2015 | Fafard | H01L 31/0304 257/461 |
| 2016/0082272 A1 * | 3/2016 | Karst | H01L 31/0322 320/101 |
| 2017/0018675 A1 * | 1/2017 | Meitl | H01L 31/165 |
| 2018/0308601 A1 * | 10/2018 | Diggins | G21H 1/12 |
| 2018/0331157 A1 | 11/2018 | Bedell | |

OTHER PUBLICATIONS

U.S. Appl. No. 15/595,388, filed May 15, 2017, Entitled: Multi-Junction Photovoltaic Cells, First Named Inventor: Stephen W. Bedell.

Bett et al.; III-V Solar Cells Under Monochromatic Illumination, 978-1-4244-1641—Jul. 2008 /IEEE 2008, pp. 1-5.

Hwang et al.; Photovoltaic Energy Converter as a Chipscale High Efficiency Power Source for Implanted Active Microelectronic Devices, Proceedings of the 26th Annual International Conference of the IEEE EMBS, San Francisco, CA, USA Sep. 1-5, 2004, 0-7803-8439—Mar. 4, 2004 IEEE—pp. 4091-4092.

Krut et al.; Monolithic Multi-Cell GaAs Laser Power Converter With Very High Current Density, 2002 IEEE, pp. 908-911.

Lumentum—Photonic Power Solutions for Sensor Applications www.lumentum.com, pp. 1-4.

Schubert et al.; High-Voltage GaAs Photovoltaic Laser Power Converter, IEEE Transactions on Electron Devices, vol. 56, No. 2, Feb. 2009, pp. 170-175.

* cited by examiner

| JUNCTION NUMBER | 2 | 3 | 4 | 5 |
|---|---|---|---|---|
| THICKNESS OF 1ST JUNCTION | 0.5um | 0.3um | 0.22um | 0.17um |
| THICKNESS OF 2ND JUNCTION | 1.4um | 0.47um | 0.3um | 0.21um |
| THICKNESS OF 3RD JUNCTION | | 1.3um | 0.48um | 0.29um |
| THICKNESS OF 4TH JUNCTION | | | 1.3um | 0.45um |
| THICKNESS OF 5TH JUNCTION | | | | 1.0um | ents of which are incorporated herein by reference in
MULTI-JUNCTION PHOTOVOLTAIC CELLS

DOMESTIC PRIORITY

This application is a continuation of U.S. patent application having the Ser. No. 15/595,388, filed May 15, 2017, the contents of which are incorporated herein by reference in their entirety.

BACKGROUND

The present invention relates in general to photovoltaic devices and more specifically, to a multi-junction photovoltaic cell for generating electricity from monochromatic light.

Photovoltaic (PV) technology involves the conversion of light into electricity using semiconducting materials that exhibit the photovoltaic effect, which is the creation of voltage or electric current in a material upon exposure to light. PV cells are generally integrated onto circuit boards in order to power electrical elements of the circuit board. As power demands of the circuit board elements increase, there is a need to add photovoltaic cells to the circuit board, causing a conflict between space dedicated to photovoltaic cells and space dedicated to circuit board elements.

SUMMARY

Embodiments of the present invention are directed to a photovoltaic device including a photovoltaic cell, the photovoltaic cell having: a first photovoltaic layer that receives light at a top surface of the first photovoltaic layer, the first photovoltaic layer having a first thickness; and a second photovoltaic layer disposed beneath the first photovoltaic layer that receives light passing through the first photovoltaic layer, the second photovoltaic layer having a second thickness; wherein the first thickness and the second thickness are selected so that a first light absorption at the first photovoltaic layer is equal to a second light absorption at the second photovoltaic layer.

Embodiments of the present invention are further directed to a photovoltaic device including a photovoltaic cell having a plurality of photovoltaic layers arranged in a stack, wherein a thickness of each of the plurality of photovoltaic layer is selected so that an amount of light absorption absorbed at each of the plurality of photovoltaic layer is the same.

Embodiments of the present invention are further directed to a method of generating electrical energy, including: irradiating a top surface of a photovoltaic cell with monochromatic light, the photovoltaic cell including a stack of photovoltaic layers that generate a current when irradiated at a wavelength of the monochromatic light, wherein a thickness of each of the photovoltaic layers is selected so that each of the photovoltaic layers absorbed a same amount of light.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
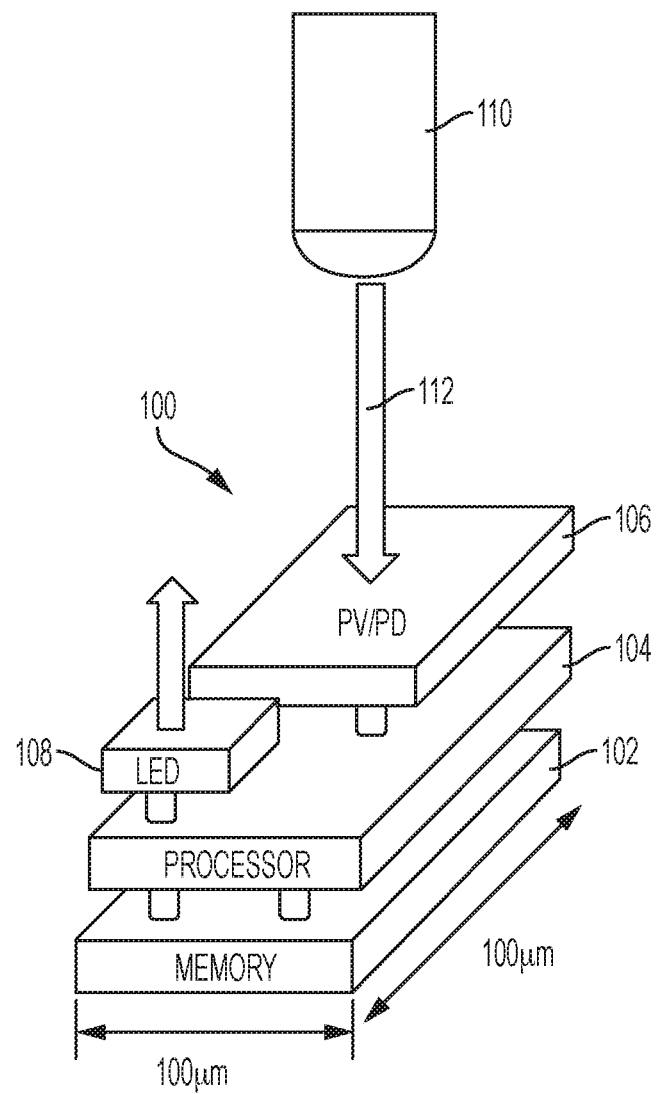
FIG. 1 depicts a perspective view of a semiconductor photovoltaic device suitable for operating on electricity generated in response to light received at the photovoltaic device according to embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1 \times 10^{19}$ cm$^{-3}$ to $2 \times 10^{21}$ cm$^{-3}$, or preferably between $2 \times 10^{20}$ cm$^{-3}$ and $1 \times 10^{21}$ cm$^{-3}$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Turning now to an overview of technologies that are more specifically relevant to aspects of the invention, conventional photovoltaic (PV) cells possess an efficiency rating of approximately 10-30% when exposed to natural or white light, thereby allowing the use of conventional PV cells to provide a selected amount of power. However, circuit elements that require power can include processors, memory cells, power storage devices, etc., which are built with increasing power demands. As integrated circuit elements that could potentially draw power from the photovoltaic power source become more complex, there is a need to provide PV technology that can generate higher voltage. However, to generate higher voltages, multiple PV cells are often formed on the substrate, where they are joined electrically in a series connection. Multiple PV cells, however, have the negative consequence of consuming greater amounts of space on the integrated circuit substrate.

Turning now to an overview of the aspects of the invention, one or more embodiments of the invention address the above-described shortcomings of the prior art by providing provide a photovoltaic cell capable of high power output without additional circuit board space requirements. The photovoltaic cell includes photovoltaic layers (PV layers) arranged in a stack in order to reduce a footprint of the PV cell, thus minimizing an amount of space or real estate used on a substrate. The PV layers have high efficiencies (e.g., up to about 60%) of optical-electrical conversion when exposed to coherent light (e.g., laser light). By arranging the PV layers in a stack and by varying the thicknesses of each PV layer, a high-efficiency (about 40-60%) multi-junction photovoltaic (MJ-PV) device can be formed. The thicknesses of the PV layers are selected so that each PV layer absorbs the same amount of light for the wavelength of the incident light.

The above-described aspects of the invention address the shortcomings of the prior art by increasing the thickness of each PV layer with depth, whereas depth is measured from the surface of the PV cell onto which the light is incident. The thickness of each PV layer can be determined based at least in part on an amount of light absorption occurring at each PV layer.

Turning now to a more detailed description of aspects of the present invention, FIG. 1 depicts a perspective view of a semiconductor photovoltaic device 100 suitable for operating on electricity generated in response to light received at the photovoltaic device 100 according to embodiments of the present invention. In various embodiments, the photovoltaic device 100 may be a processor assembly that operates on optical power. The device 100 includes a memory layer 102 having a memory device formed therein, a processor layer 104 having a processor formed therein, and a PV cell 106 for converting light into electrical current and to provide a voltage for powering the device 100. The device 100 further includes an LED 108 formed on the processor layer 104 and controlled by the processor to transmit optical signals.

In various embodiments of the invention, the memory layer 102 is a bottom layer of the device 100 and the processor layer 104 is formed on top of the memory layer 102. Wired connections between the processor layer 104 and the memory layer 102 provide data transfer between the processor of the processor layer 104 and the memory device of the memory layer 102. Therefore, the processor can store data to the memory device and retrieve data from the memory device.

PV cell 106 is formed on top of the processor layer 104 and is in wired connection with the processor layer 104 to provide power to the processor layer 104. Light 112 from external light source 110 is incident on a top surface of the PV cell 106. The external light source 110 provides coherent monochromatic light 112 to the PV cell 106 and the material of the PV cell 106 is selected to generate electricity when irradiated at the wavelength of the incident light 112. In various embodiments of the invention, the specific wavelength of light is about 660 nanometers. The external light source 110 may be a laser light source, an LED or any other monochromatic light source.

In various embodiments of the invention, photovoltaic cell 106 generates from about 3.0 volts to about 4.0 volts to power the PV device 100. The electricity generated by the photovoltaic cell 106 is used to provide electrical power to the processor layer 104 and memory layer 102 and to provide power for operating the LED 108. In various embodiments of the invention, a driving voltage of the LED 108 is from about 2 volts to about 3 volts. In various embodiments of the invention, the photovoltaic cell 106 can charge a battery (not shown) to a voltage of about 3.5 volts. In various embodiments of the invention, a foot print of the photovoltaic device 100 can be about 100 micrometers by 100 micrometers.

Figure 2:
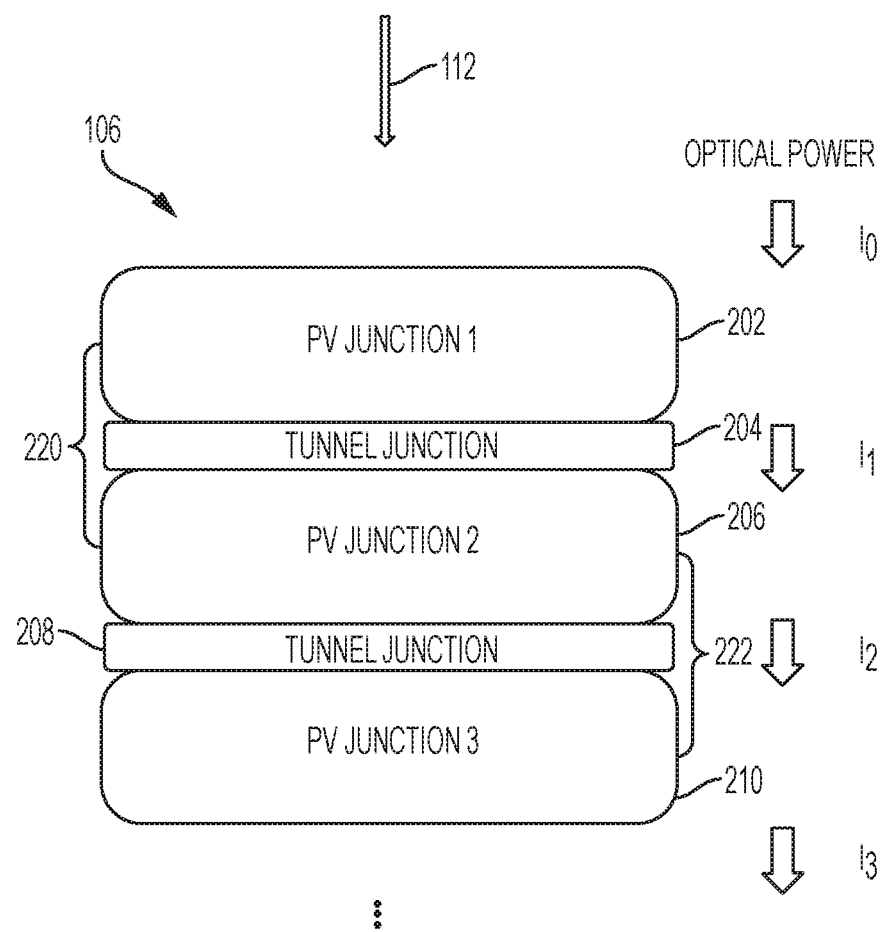
FIG. 2 depicts a block diagram of a photovoltaic cell of the photovoltaic device of FIG. 1 in various embodiment of the present invention.

FIG. 2 depicts a block diagram of the PV cell 106 in various embodiments of the invention of the present invention. The PV cell 106 includes a plurality of photovoltaic layers arranged in a stack. A tunnel layer is sandwiched between each of the plurality of photovoltaic layers. An upper surface of the tunnel layer is in direct contact with the photovoltaic layer above the tunnel layer, and a lower surface of the tunnel layer is in direct contact with the photovoltaic layer below the tunnel layer. In the illustrative embodiment of FIG. 2, the photovoltaic cell 106 includes three photovoltaic layers. However, the number of photovoltaic layer is not meant to be a limitation of the invention. The photovoltaic cell 106 can include any number of photovoltaic layers to meet various technical specifications.

Illustrative photovoltaic cell 106 includes first PV layer 202, second PV layer 206, and third PV layer 210, with the first PV layer 202 being at the top of the PV cell 106, the second PV layer 206 being in the middle of the PV cell 106 and the third PV layer 210 being at the bottom of the PV cell 106. A first tunnel layer 204 is sandwiched between the first PV layer 202 and the second PV layer 206. A second tunnel layer 208 is sandwiched between second PV layer 206 and third PV layer 210. The first PV layer 202, second PV layer 206 and third PV layer 210 are linked in series as shown by electrical connections 220 and 222. By connecting the PV layers 202, 206 210, the total voltage output of the PV cell 106 is a summation of the voltage outputs at each PV layer 202, 206, 210. Additionally, the voltage can be increased by adding another PV layer to the stack of PV layers, thereby allowing the PV cell to be created that provides a particular voltage output. Light 112 is incident from the external light source 110 at a top surface of the first PV layer 202 and passes through first tunnel layer 204, second PV layer 206, second tunnel layer 208 and third PV layer 210.

The intensity of light diminishes as the light passes through each PV layer (202, 206, 210). The thickness of a selected PV layer and the absorption coefficient of the material of the PV layer determines the amount of light absorbed by the selected PV layer and therefore the amount of electricity and/or voltage generated by the selected PV layer. The thickness of the PV layers 202, 206 and 210 are selected so that the first PV layer 202, the second PV layer 206, and the third PV layer 210 generate the same or approximately the same open-circuit voltage ($V_{OC}$) when subject to the light provided to the particular layer. The intensity of light provided to the top surface of the second PV layer 206 is less than the intensity of light provided to the top surface of the first PV layer 202 due to light absorption at the first PV layer 202. Therefore, the thickness of the second PV layer 206 is greater than the thickness of the first PV layer 202 so that both PV layers 202 and 206 produce the same $V_{OC}$. Similarly, the intensity of light incident at the top surface of the third PV layer 210 is less than the intensity of light incident at the top surface of the second PV layer 206 due to light absorption at the second PV layer 206. Therefore, the thickness of the third PV layer 210 is greater than the thickness of the second PV layer 206 so that both PV layers 206 and 210 produce the same $V_{OC}$.

In order to determine the thickness the PV layers 202, 206, 210, light absorption calculations are made to provide that the amount of light absorbed at each PV layer is the same for each PV layer. The intensity of light incident at the top surface of the first PV layer 202 is represented as $I_0$. Similarly, the intensity of light exiting the first PV layer 202 and incident on the second PV layer 206 is represented as $I_1$, and the intensity of light exiting the second PV layer 206 and incident on the third PV layer 210 is represented as $I_2$. Finally, the intensity of light exiting the bottom surface of the third PV layer 210 is represented as $I_3$. The relation between these intensities is detailed in Eqs. (1)-(3) below:

$$I_1 = I_0 \exp(-\alpha d_1) \quad \text{Eq. (1)}$$

$$I_2 = I_1 \exp(-\alpha d_2) \quad \text{Eq. (2)}$$

$$I_3 = I_2 \exp(-\alpha d_3) \quad \text{Eq. (3)}$$

where $\alpha$ is the absorption coefficient of the material of the PV layers, $d_1$ is the thickness of the first PV layer 202, $d_2$ is the thickness of the second PV layer 206 and $d_3$ is the thickness of the third PV layer 210. Because the PV layers are made of the same material, the absorption coefficient $\alpha$ of each PV layer is identical. Eq. (4) represents a condition of equal light absorption at each PV layer:

$$I_0 - I_1 = I_1 - I_2 = I_2 - I_3 \quad \text{Eq. (4)}$$

From Eqs. (1)-(4), it can be determined that $$1 - \exp(-\alpha d_1) = \exp(-\alpha d_1)(1 - \exp(-\alpha d_2)) = \exp(-\alpha d_1) \exp(-\alpha d_2)(1 - \exp(-\alpha d_3)) \quad \text{Eq. (5)}$$

The first equality of Eq. (5) can be used to determine a relation between $d_1$ and $d_2$. These values can then be used in the second equality of Eq. (5) to determine the relation between $d_3$ and $d_1$, $d_2$. For a PV cell 106 having additional PV layers, Eqs. (4) and (5) can be extended appropriately to determine the relation between the thicknesses of all of the PV layers.

In various embodiments of the invention, the thicknesses of the PV layers are selected so that the intensity of light exiting the bottom-most PV layers ($I_3$ in the illustrative embodiment of FIG. 2) is substantially zero. Therefore, for a PV cell having N PV layers, each PV layer absorbs 1/N of the incident light.

Figures 3, 4:
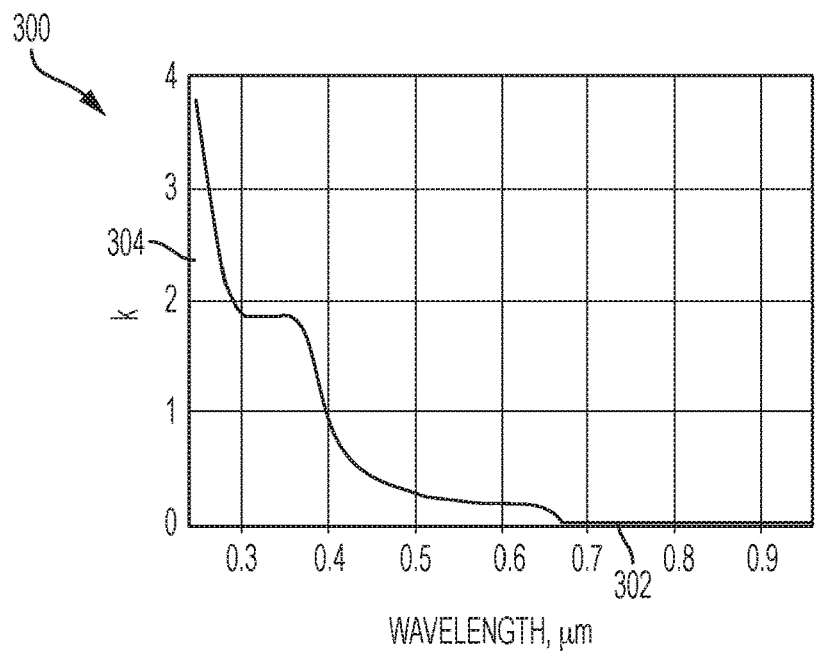
FIG. 3 depicts a graph of an absorption coefficient vs. wavelength for InGaP.
FIG. 4 depicts a chart of calculated thicknesses for the photovoltaic layers of photovoltaic cells irradiated with coherent light at a wavelength of 660 nanometers.

The thickness of the PV layers is dependent on the extinction coefficient or absorption coefficient of the material. FIG. 3 depicts a graph 300 of an absorption coefficient $\alpha$ vs. wavelength for InGaP. Values of wavelength of light shown on the x-axis 302 and values of the extinction coefficient $\alpha$ are shown on the y-axis 304. Values of $\alpha$ are selected for the desired wavelength of the incident light, and selected values are used to determine layer thicknesses.

FIG. 4 depicts a chart 400 of calculated layer thicknesses for the PV layers of PV cells irradiated with coherent light at a wavelength of 660 nm. The material of the PV layers is indium gallium phosphide (InGaP). The thickness is dependent upon the PV diode's location within the PV device 100. The chart 400 includes column 402 disclosing layer thicknesses for a PV cell having two PV layers, column 404 disclosing layer thicknesses for a PV cell having three PV layers, column 406 disclosing layer thicknesses for a PV cell having four PV layers, and column 408 disclosing layer thicknesses for a PV cell having five PV layers. Layer thicknesses were determined using Equations 1-5, adjusted for the particular number of PV layers. The chart 400 shows that the thickness of each layer increases with the depth of the layer. The increased PV layer thickness with depth compensates for attenuation of light intensity with depth so that each PV layer generates a same $V_{OC}$.

Figure 5:
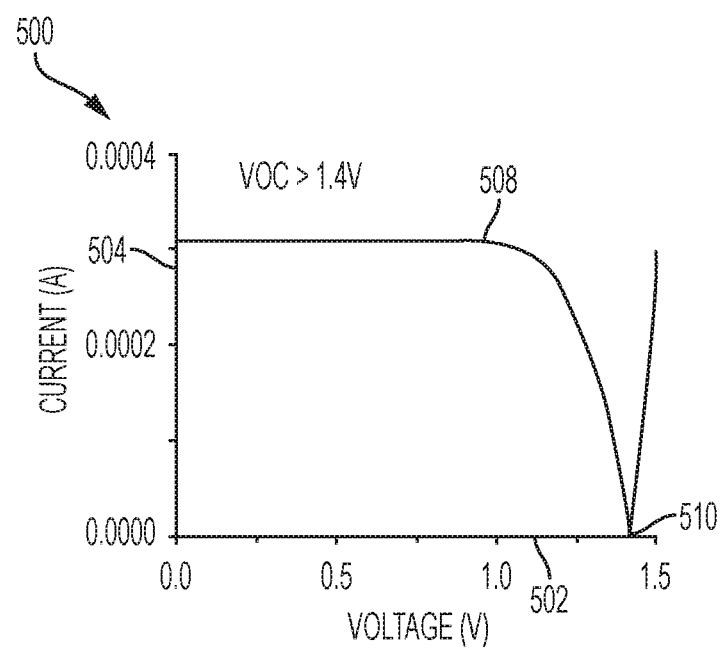
FIG. 5 depicts a graph of current vs. output voltage for a photovoltaic layer of a photovoltaic cell including a photovoltaic material made of InGaP.

FIG. 5 depicts a graph 500 of current vs. output voltage for a layer of a PV cell including a photovoltaic material made of InGaP. Voltage is shown along the x-axis 502 and current is shown along y-axis 504. The open circuit voltage $V_{OC}$ is indicated as the voltage where the current curve 508 drops to zero and is indicated at the voltage indicated at current extinction voltage 510. The shape of graph 500 and the open circuit voltage $V_{OC}$ is a property of the material of the PV cell. The $V_{OC}$ of graph 500 is approximately 1.4 volts.

Figure 6:
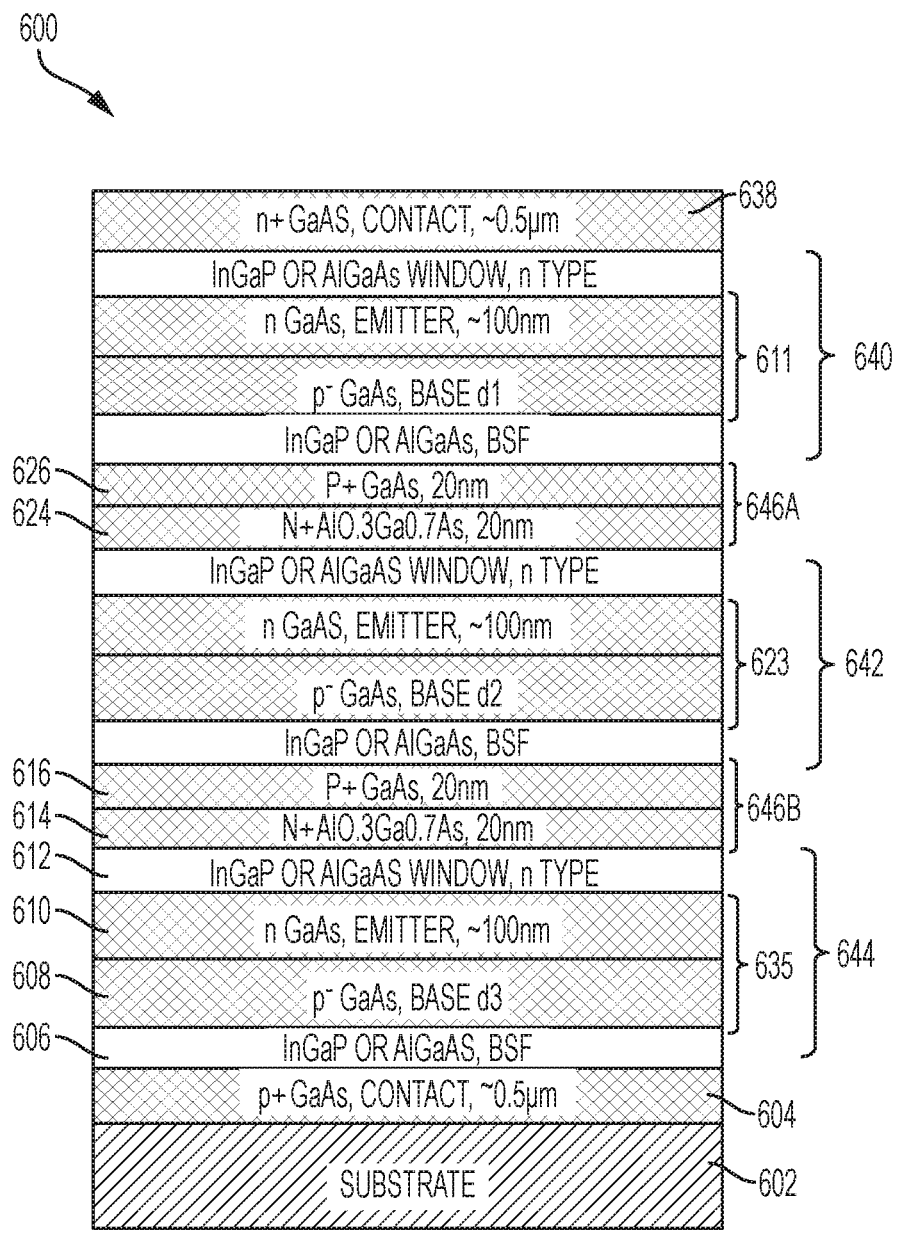
FIG. 6 depicts a block diagram of a multi-junction photovoltaic device using three GaAs p-material, n-material (PN) diodes.

FIG. 6 depicts a block diagram of a MJ-PV device 600 using three GaAs p-material, n-material (PN) diodes in an embodiment of the invention. The MJ-PV device 600 includes a substrate 602, a first contact layer 604 disposed onto the substrate 602 and comprising p+ GaAs material approximately 0.5 μm thick. A third PV layer subassembly 644 is disposed onto the first contact layer 604 and includes a BSF 606 comprised of InGaP or AlGaAs, a p-type layer 608 comprised of a GaAs material and having a thickness of "d3", an n-type GaAs emitter 610 having a thickness of approximately 100 nm, and a window layer 612 comprising an n-type InGaP or AlGaAs material. The p-type layer 608 and the n-type GaAs emitter 610 combine to form a PN diode 635. The first contact layer 604 establishes an electrical connection to the third PV layer subassembly 640 and allows other devices and structures on the substrate 602 to make a first electrical connection to the MJ-PV device 600.

Additional PV layer subassemblies are included in the MJ-PV device 600 using substantially the same materials and layers as the first PV layer subassembly 644, but employing differing thicknesses of the PV diode 635 depending on the location of the subassembly in the MJ-PV device 600. Additional subassemblies include a second PV layer subassembly 642 with a PN diode 623 having a thickness of "d2", and a first PV layer subassembly 644 with a third PN diode 635 and having a thickness of "d1". Thicknesses d1, d2, and d3 are determined by applying Equations 1-5 as disclosed herein.

Continuing with the description of MJ-PV device 600, a second tunnel layer 646B is interposed between the third PV layer subassembly 644 and the second PV layer subassembly 642. The second tunnel layer 646B includes two layers: an N+ $Al_{0.3}Ga_{0.7}As$ layer 614 that is approximately 20 nm thick and a P+ GaAs layer 616 that is approximately 20 nm thick. The second tunnel layer 646B provides a serial electrical interconnection between the third PV layer subassembly 644 and the second PV layer subassembly 642, therefore enabling current to flow between the third PV layer subassembly 644 and the second PV layer subassembly 642. Similarly, a first tunnel layer 646A is interposed between the second PV layer assembly 642 and the first PV layer subassembly 640 and provides a serial electrical interconnection between the second PV layer subassembly 642 and the first PV layer subassembly 640, therefore enabling current to flow between the second PV layer subassembly 642 and the first PV layer subassembly 640. The first tunnel layer 646A includes two layers: an N+ $Al_{0.3}Ga_{0.7}As$ layer 624 that is approximately 20 nm thick and a P+ GaAs layer 626 that is approximately 20 nm thick. Also included in the MJ-PV device 600 is a second contact layer 638 disposed onto the first PV layer subassembly 644 and comprising n+ GaAs material approximately 0.5 μm thick. The second contact layer 638 establishes an electrical connection to the first PV layer subassembly 644 and allows other devices and structures on the substrate 602 to establish a second electrical connection to the MJ-PV device 600.

FIG. 6, as described herein, includes first PN diode 611, second PN diode 623, and third PN diode 635, where each diode has a $V_{OC}$ of approximately 0.6 to 0.8 volts. As first PN diode 611, second PN diode 623, and third PN diode 635 are connected serially, the total $V_{OC}$ of the MJ-PV device 600 is approximately 1.8-2.4 volts. In at least some embodiments of the present invention, the $V_{OC}$ is approximately 2.0 volts. In this example, thicknesses for the first PN diode 611, second PN diode 623, and third PN diode 635 are 260 nm, 480 nm, and 1500 nm, respectfully.

Figure 7:
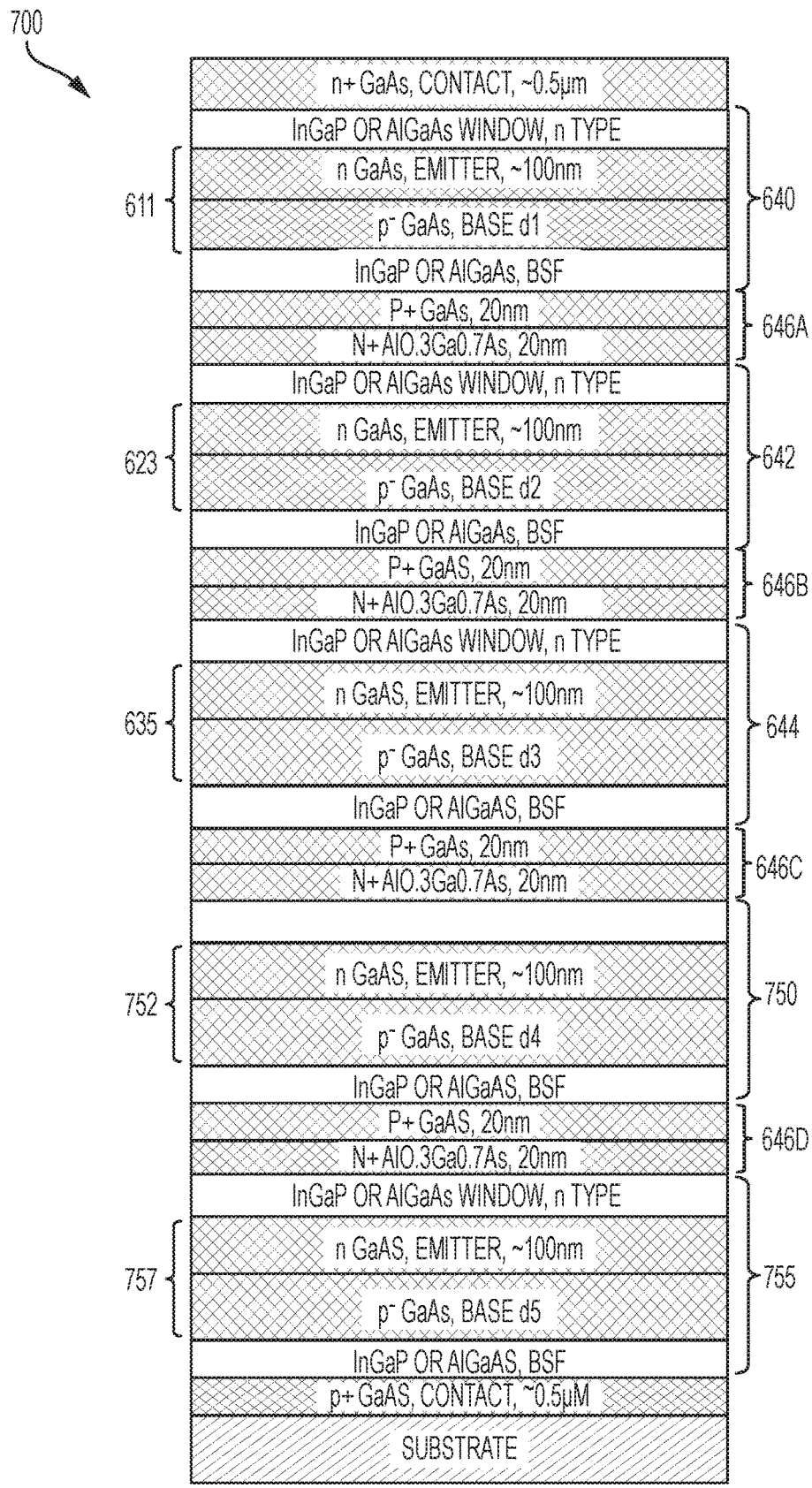
FIG. 7 depicts a block diagram of a multi-junction photovoltaic device using five GaAs PN diodes.

FIG. 7 depicts a block diagram of a MJ-PV device 700 using five GaAs PN diodes in an embodiment of the invention. FIG. 7 uses substantially the same components and devices as illustrated in FIG. 6 and accordingly, the same reference numbers as appropriate. Additional elements to the MJ-PV device 700 include a fourth PV layer subassembly 750 having a fourth PN diode 752 and a fifth PV junction subassembly 755 having a fifth PN diode 757. The MUJ-PV device also includes a third tunnel layer 646C and a fourth tunnel layer 646D. In this arrangement, MJ-PV device 700 generates a $V_{OC}$ of approximately 3.5 volts employing GaAs materials. Thicknesses of the materials vary from those shown in FIG. 6. Thicknesses are approximately 100 nm (first PN diode 611), approximately 150 nm (second PN diode 623), approximately 240 nm (third PN diode 735), approximately 420 nm (fourth PN diode 752), and approximately 1100 nm (fifth PN diode 757).

In some embodiments of the invention, various functions or acts can take place at a given location and/or in connection with the operation of one or more apparatuses or systems. In some embodiments of the invention, a portion of a given function or act can be performed at a first device or location, and the remainder of the function or act can be performed at one or more additional devices or locations.

The corresponding structures, materials, acts, and equivalents of all means or step plus function elements in the claims below are intended to include any structure, material, or act for performing the function in combination with other claimed elements as specifically claimed. Embodiments of the present invention have been presented for purposes of illustration and description, but is not intended to be exhaustive or limited to the form described. Many modifications and variations will be apparent to those of ordinary skill in the art without departing from the scope and spirit of the invention. The embodiments of the invention were chosen and described in order to best explain the principles of the invention and the practical application, and to enable others of ordinary skill in the art to understand the invention for various embodiments of the invention with various modifications as are suited to the particular use contemplated.

The flowchart and block diagrams in the figures illustrate the functionality and operation of possible implementations of systems and methods according to various embodiments of the present invention. In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. The actions can be performed in a differing order or actions can be added, deleted or modified. Also, the term "coupled" describes having a signal path between two elements and does not imply a direct connection between the elements with no intervening elements/connections therebetween. All of these variations are considered a part of the invention.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The terminology used herein is for describing particular embodiments of the invention only and is not intended to be limiting of embodiments of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated integers, steps, operations, elements, and/or components, but do not preclude the presence or addition of one or more other integers, steps, operations, element components, and/or groups thereof.

While embodiments of the present invention have been described in detail in connection with only a limited number of embodiments, it should be readily understood that embodiments of the present invention are not limited to such described embodiments. Rather, embodiments of the present invention can be modified to incorporate any number of variations, alterations, substitutions or equivalent arrangements not heretofore described, but which are commensurate with the spirit and scope of the present invention. Additionally, while various embodiments of the present invention have been described, it is to be understood that aspects of the present invention can include only some of the described embodiments. Accordingly, the present invention is not to be seen as limited by the foregoing description, but is only limited by the scope of the appended claims.

What is claimed is:

1. A method of operating a device for generating a signal, comprising:
   selecting a predetermined wavelength of a monochromatic light;
   providing a processor layer vertically stacked over a memory layer;
   providing a light emitting device (LED) vertically stacked over a first portion of the processor layer;
   providing a photovoltaic cell vertically stacked over a second portion of the processor layer,
   the photovoltaic cell comprising a first photovoltaic layer having a first thickness $d_1$ and a second photovoltaic layer having a second thickness $d_2$;
   wherein the first photovoltaic layer comprises indium gallium phosphide and the second photovoltaic layer comprises indium gallium phosphide having a same absorption coefficient $\alpha$ as the first photovoltaic layer;

wherein the photovoltaic cell is configured to generate a current when irradiated with the monochromatic light at the predetermined wavelength to power the LED;

wherein the first photovoltaic layer and the second photovoltaic layer generate a same open-circuit voltage based on the absorption coefficient $\alpha$ for the predetermined wavelength;

wherein the first thickness $d_1$ and the second thickness $d_2$ satisfy the equality:

$$1-\exp(-\alpha d_1)=\exp(-\alpha d_1)-\exp(-\alpha(d_1+d_2));$$

wherein a ratio of the second thickness $d_2$ to the first thickness $d_1$ is at most 2.8 and at least 1.2; and wherein the ratio is based at least in part on whether the photovoltaic cell includes any photovoltaic layers in addition to the first photovoltaic layer and the second photovoltaic layer; and irradiating a top surface of the photovoltaic cell with the monochromatic light at the predetermined wavelength to power the LED.

2. The method of claim 1, wherein a voltage across each of the photovoltaic layers is substantially the same when irradiated at the wavelength of the monochromatic light.

3. The method of claim 1, wherein the thickness of each of the photovoltaic layers is selected so that the light intensity exiting a bottommost surface of the photovoltaic layers is substantially zero.

4. The method of claim 1, further comprising operating a processor in the processor layer coupled to the photovoltaic cell using the current generated at the photovoltaic layers.

5. The method of claim 4, further comprising storing data to and retrieving data from a memory layer coupled to the processor layer.

6. The method of claim 4, further comprising controlling operation of the LED coupled to the processor layer in order to generate an optical signal.

\* \* \* \* \*